United States Patent
Sedlak et al.

(10) Patent No.: US 10,041,708 B2
(45) Date of Patent: Aug. 7, 2018

(54) HEAT PUMP AND METHOD FOR PUMPING HEAT IN A FREE COOLING MODE

(71) Applicant: Efficient Energy GmbH, Feldkirchen (DE)

(72) Inventors: Holger Sedlak, Sauerlach (DE); Oliver Kniffler, Sauerlach (DE)

(73) Assignee: Efficient Energy GmbH, Feldkirchen (DE)

( * ) Notice: Subject to any disclaimer, the term of this patent is extended or adjusted under 35 U.S.C. 154(b) by 379 days.

(21) Appl. No.: 14/542,095

(22) Filed: Nov. 14, 2014

(65) Prior Publication Data

US 2015/0068228 A1 Mar. 12, 2015
US 2018/0003417 A9 Jan. 4, 2018

Related U.S. Application Data

(63) Continuation of application No. PCT/EP2013/060064, filed on May 15, 2013.
(Continued)

(30) Foreign Application Priority Data

May 16, 2012 (DE) .................. 10 2012 208 174

(51) Int. Cl.
| | |
|---|---|
| F25B 7/00 | (2006.01) |
| F25B 30/02 | (2006.01) |
| F25B 25/00 | (2006.01) |
| F25B 1/00 | (2006.01) |
| F25B 13/00 | (2006.01) |

(Continued)

(52) U.S. Cl.
CPC .............. *F25B 30/02* (2013.01); *F25B 1/005* (2013.01); *F25B 13/00* (2013.01); *F25B 25/005* (2013.01); *H05K 7/20* (2013.01); *F24H 4/00* (2013.01); *F25B 2339/047* (2013.01); *F25B 2400/06* (2013.01); *F25B 2700/2106* (2013.01); *Y02B 30/12* (2013.01)

(58) Field of Classification Search
CPC .......... F25B 13/00; F25B 1/00; F25B 41/056; Y02B 30/123
USPC ............ 62/79, 324.1, 324.6, 115, 498, 238.7
See application file for complete search history.

(56) References Cited

U.S. PATENT DOCUMENTS

| | | | | |
|---|---|---|---|---|
| 4,031,712 A | * | 6/1977 | Costello | .................. F25B 15/00 62/483 |
| 4,653,287 A | * | 3/1987 | Martin, Jr. | .......... F24D 11/0214 237/2 B |

(Continued)

FOREIGN PATENT DOCUMENTS

| | | |
|---|---|---|
| CN | 201340013 Y | 11/2009 |
| CN | 102239372 A | 11/2011 |

(Continued)

*Primary Examiner* — Melvin Jones
(74) *Attorney, Agent, or Firm* — Michael A. Glenn; Perkins Coie LLP

(57) ABSTRACT

A heat pump includes an evaporator with an evaporator inlet and an evaporator outlet; a compressor for compressing operating liquid evaporated in the evaporator; and a condenser for condensing evaporated operating liquid compressed in the compressor, wherein the condenser includes a condenser inlet and a condenser outlet, wherein the evaporator inlet is connected to a return from a region to be heated, and wherein the condenser inlet is connected to a return from a region to be cooled.

31 Claims, 7 Drawing Sheets

Related U.S. Application Data

(60) Provisional application No. 61/754,338, filed on Jan. 18, 2013.

(51) Int. Cl.
*H05K 7/20* (2006.01)
*F24H 4/00* (2006.01)

(56) References Cited

U.S. PATENT DOCUMENTS

| | | | |
|---|---|---|---|
| 6,672,099 B1 | 1/2004 | Yoshimi et al. | |
| 7,841,201 B2 | 11/2010 | Sedlak et al. | |
| 2005/0011214 A1* | 1/2005 | Ratliff | B60H 1/3223 |
| | | | 62/324.1 |

FOREIGN PATENT DOCUMENTS

| | | |
|---|---|---|
| DE | 19502153 A1 | 8/1996 |
| DE | 19622609 A1 | 12/1997 |
| DE | 202006005461 U1 | 8/2007 |
| DE | 102010049134 A1 | 8/2011 |
| EP | 0811809 A2 | 12/1997 |
| EP | 2016349 B1 | 5/2011 |
| JP | S60182950 | 9/1985 |
| JP | 02197774 A | 8/1990 |
| JP | H07280386 | 10/1995 |
| JP | 2001074322 A | 3/2001 |
| JP | 2008275288 A | 11/2008 |
| JP | 2010230264 A | 10/2010 |
| JP | 2011114368 A | 6/2011 |
| JP | 2011133142 A | 7/2011 |
| WO | 2011141503 A1 | 11/2011 |

\* cited by examiner

HEAT PUMP AND METHOD FOR PUMPING HEAT IN A FREE COOLING MODE

CROSS-REFERENCE TO RELATED APPLICATIONS

This application is a continuation of copending International Application No. PCT/EP2013/060064, filed May 15, 2013, which is incorporated herein by reference in its entirety, and additionally claims priority from German Application No. 102012208174.7, filed May 16, 2012, and also claims priority to U.S. patent application Ser. No. 61/754,338, filed Jan. 18, 2013, both of which are incorporated herein by reference in their entirety.

The present invention relates to heat pump applications and in particular to heat pumps suitable for an efficient free cooling mode.

BACKGROUND OF THE INVENTION

Typical fields of usage of heat pumps are to cool a region to be cooled and/or to heat a region to be heated. A heat pump typically consisting of an evaporator, a compressor and a condenser comprises, for this purpose, an evaporator side on the one hand and a condenser side on the other hand, as is shown exemplarily by the heat pump 100 in FIG. 5. The heat pump is coupled to a heat exchanger 102 on the evaporator side and a heat exchanger 104 on the condenser side. For this purpose, the heat pump 100 in particular includes an evaporator inlet 101a and an evaporator outlet 101b. Above that, the heat pump 100 comprises a condenser inlet 103a and a condenser outlet 103b. The operating liquid on the evaporator side is introduced into the evaporator of the heat pump 100 via the evaporator inlet 101a, cooled there and let out from the evaporator outlet 101b as colder operating liquid. At the same time, as shown in FIG. 5, the evaporator inlet 101a and the evaporator outlet 101b are coupled to the heat exchanger 102, such that a hotter operating liquid (having the temperature t) is fed into the heat exchanger, cooled in the heat exchanger and then transported to the region to be cooled. Typical temperature ratios are shown in FIG. 5, wherein a "heat exchanger loss" of 1° Celsius is assumed. In particular, t is, e.g., the set temperature in the region to be cooled.

The heat exchanger 102 or 104 has a primary side directed towards the heat pump and a secondary side facing away from the heat pump, i.e. to the region to be cooled or the region to be heated. The primary side of the heat exchanger 102 includes the hot terminal 101a and the cold terminal 101b, wherein "hot" and "cold" are to be seen as terms, and wherein the medium is hotter in terminal 101a than in terminal 101b. Accordingly, the hot terminal of the primary side of the heat exchanger 104 is the terminal 103b, and the cold terminal is the terminal 103a. On the secondary side of the heat exchangers 102 or 104, the hot terminal is in each case the top terminal and the cold terminal is in each case the bottom terminal in FIG. 5.

On the condenser side of the heat pump 100, the condenser outlet 103b is connected to the "hot" terminal of the heat exchanger 104, and the condenser inlet is connected to the colder end of the heat exchanger 104. Above that, on its other side facing away from the heat pump 100, the heat exchanger is connected to the region to be heated, where a set temperature T should prevail.

If the heat pump is used as a cooling unit, the region to be cooled will, so to speak, be the "effective side". The region to be cooled can, for example, be an indoor room, such as a computer room or another room to be cooled or air-conditioned. Then, the region to be heated would, for example, be the outside wall of a building or a rooftop or another region into which waste heat is to be introduced. If, however, the heat pump 100 is used as heating, the region to be heated will, so to speak, be the "effective side" and the region to be cooled would, for example, be soil, ground water or the like.

In such heat pump applications as shown in FIG. 5, it is problematic that the configuration does not take into consideration that the ambient temperature of the region to be heated, when the same is, for example, outdoors, varies heavily. In winter, temperatures of −20° Celsius can prevail, and in summer temperatures of over 30° Celsius. If, for example, an application is considered where a computer room is air-conditioned, it would be sufficient, for the case that the ambient temperature is, e.g., in the range of or below the set temperature in the region to be cooled, to no longer air-condition the computer room at all, but to simply "open the windows". This is, however, problematic, since computer rooms do not necessarily have windows and because, at the same time when such cooling is considered, it is relatively difficult to check that there is a constant temperature in the room, because of the fact that particularly cold zones might possibly form close to the windows, if there are any, while further away from the windows or behind specific racks hot zones form that might not be sufficiently cooled. On the other hand, it is problematic in that, in a heat pump configuration such as is illustrated in FIG. 5, the fact that the ambient temperatures can vary heavily and in particular frequently lie within ranges where cooling is normally not necessitated, is not put to effective use. For that reason, a configuration as illustrated in FIG. 5 is implemented for the worst-case situation, i.e. for example for a very hot summer day, although such a hot summer day is, on average, very rare, at least in Germany, and the main part of the time within one year has temperatures where the cooling capacity that may be used is far below the requested worst-case situation.

SUMMARY

According to an embodiment, a heat pump may have: an evaporator with an evaporator inlet and an evaporator outlet; a compressor for compressing operating liquid evaporated in the evaporator; and a condenser for condensing evaporated operating liquid compressed in the compressor, wherein the condenser includes a condenser inlet and a condenser outlet, wherein the evaporator inlet is connected to a return from a region to be heated, and wherein the condenser inlet is connected to a return from a region to be cooled.

According to another embodiment, a method for pumping heat with a heat pump including an evaporator with an evaporator inlet and an evaporator outlet, a compressor for compressing operating liquid evaporated in the evaporator, and a condenser for condensing evaporated operating liquid compressed in the compressor, wherein the condenser includes a condenser inlet and a condenser outlet, may have the steps of: introducing operating liquid from a return from a region to be heated into the evaporator inlet; and introducing operating liquid from a return from a region to be cooled into the condenser inlet.

According to another embodiment, a method for producing a heat pump may have the steps of: providing an evaporator with an evaporator inlet and an evaporator outlet, a compressor for compressing operating liquid evaporated in the evaporator; and a condenser for condensing evaporated operating liquid compressed in the compressor, wherein the condenser includes a condenser inlet and a condenser outlet; connecting the evaporator inlet to a return from a region to be heated; and connecting the condenser inlet to a return from a region to be cooled.

According to another embodiment, a heat pump system may have: a region to be heated with a return from the region to be heated; a region to be cooled with a return from the region to be cooled; and a heat pump according to claim 1.

The present invention is based on the realization that the fact that ambient temperatures are frequently within ranges that are far below the maximum temperatures is taken effectively into account when the heat pump is not operated in the classic configuration but in a configuration where the return from the region to be heated is connected to the evaporator inlet and the return from the region to be cooled is connected to the condenser inlet. In this so-called free cooling mode, the fact is utilized that the return temperature from the region to be heated is already within the range of the temperature at which the evaporator is normally "fed". Above that, the fact is utilized that the return from the region to be cooled is already within such temperature ranges where the condenser of the heat pump can be "fed". This has the effect that the temperature difference that the heat pump has to provide between the evaporator outlet and the condenser outlet rapidly decreases compared to the normal mode. Since the temperature difference to be provided by the heat pump enters the consumed drive capacity in a square manner, in particular for the compressor, this leads to a significant efficiency increase of the heat pump which cannot be obtained with the standard configuration as illustrated in FIG. 5.

Thus, according to the invention, in deviation from a standard configuration where the evaporator inlet is connected to the return from the region to be cooled, and where the condenser inlet is connected to the return from the region to be heated, the alternative configuration is used, such that the water cycle flows from the return of the region to be heated via the evaporator to the region to be cooled, returns from there and flows into the region to be heated via the condenser.

Embodiments of the present invention further comprise a changeover means by which the heat pump can be operated in the free cooling mode or the normal operating mode, i.e. in the normal configuration, depending on control instructions. Advantageously, changeover takes place when the ambient temperatures become so high that the cooling capacity of the heat pump in the free cooling mode is no longer sufficient, i.e. that the return from the region to be heated is so high that the evaporator can no longer be "fed" by this, or that the evaporator can no longer provide the cooling for the heat exchanger of the region to be cooled, or the supply to the region to be cooled, to be provided by the normal heat pump. Changeover can also take place manually or in a time-controlled manner or by a combination of the stated measures.

In an embodiment of the present invention, the control for the switching means takes place, for example, by means of a temperature sensor in the region to be heated. In a further embodiment, the switching means is implemented as four changeover switches to reconfigure the return lines of the two regions, i.e. the region to be cooled and the region to be heated, accordingly.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
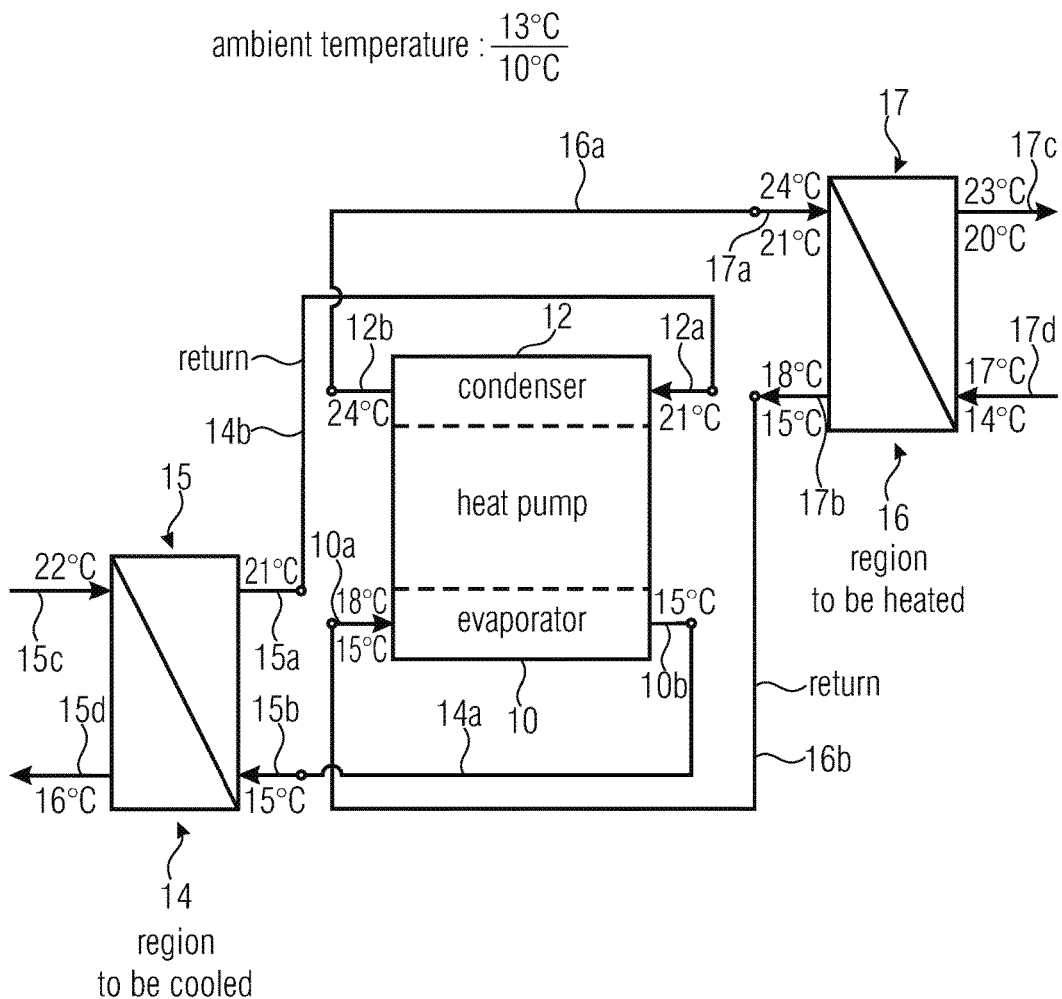
FIG. 1 shows a block diagram of a heat pump system in a configuration suitable for the free cooling mode.

FIG. 1 shows a heat pump system having a heat pump and a region to be heated and a region to be cooled and in particular having forward lines to the regions and return lines from the regions. The heat pump includes an evaporator 10 with an evaporator inlet 10a and an evaporator outlet 10b. Further, the heat pump includes a condenser 12 having a condenser inlet 12a and a condenser outlet 12b. Further, the heat pump typically includes a compressor for compressing operating liquid evaporated in the evaporator, wherein the condenser 12 is implemented to compress the evaporated operating liquid compressed in the compressor. The compressor is advantageously implemented as a turbo compressor having a typically fast rotating radial wheel to manage the compressor capacity that may be used. An exemplary heat pump is described in EP 2016349 B1 which is incorporated herein by reference.

Above that, the heat pump configuration in FIG. 1 includes forward and return lines, wherein in particular a forward line to a region to be cooled 14 is indicated by 14a, and wherein a return line from the region to be cooled 14 is indicated by 14b. Further, a region to be heated 16 is allocated to the heat pump, which again comprises a forward line 16a and a return line 16b. Above that, in one embodiment of the invention, a heat exchanger 15 is allocated to the region to be cooled 14, and a heat exchanger 17 is allocated to the region to be heated. Both heat exchangers 15, 17 each have again a primary side directed towards the heat pump, and a secondary side facing away from the heat pump, i.e. to the region to be cooled in the case of the heat exchanger 15 and the region to be heated in the case of the heat exchanger 17. The primary side of the heat exchanger 15 includes the hot terminal 15a coupled to the return 14b, and includes the cold terminal 15b coupled to the forward 14a. On the secondary side, the heat exchanger further includes a hot terminal 15c and a cold terminal 15d.

Accordingly, the heat exchanger 17 allocated to the region to be heated again includes a hot terminal 17a connected to the forward 16a, and a cold terminal 17b connected to the return 16b. On the secondary side, the heat exchanger 17 again includes a hot terminal 17c and a cold terminal 17d. It should be noted that the heat exchangers are not absolutely necessitated. Instead, the operating liquid can also be guided directly into the region to be heated or into the region to be cooled, wherein, however, there will be a forward and a return into or from the region to be heated or to be cooled. It should be noted that the terms "hot" and "cold" should be seen as terms, wherein, however, it should be noted that the liquid in the hot terminal is hotter than the cold terminal Thus, the hot terminal of the primary side of the heat exchanger 15 is the terminal 15a and the cold terminal is the terminal 15b.

Figure 6:
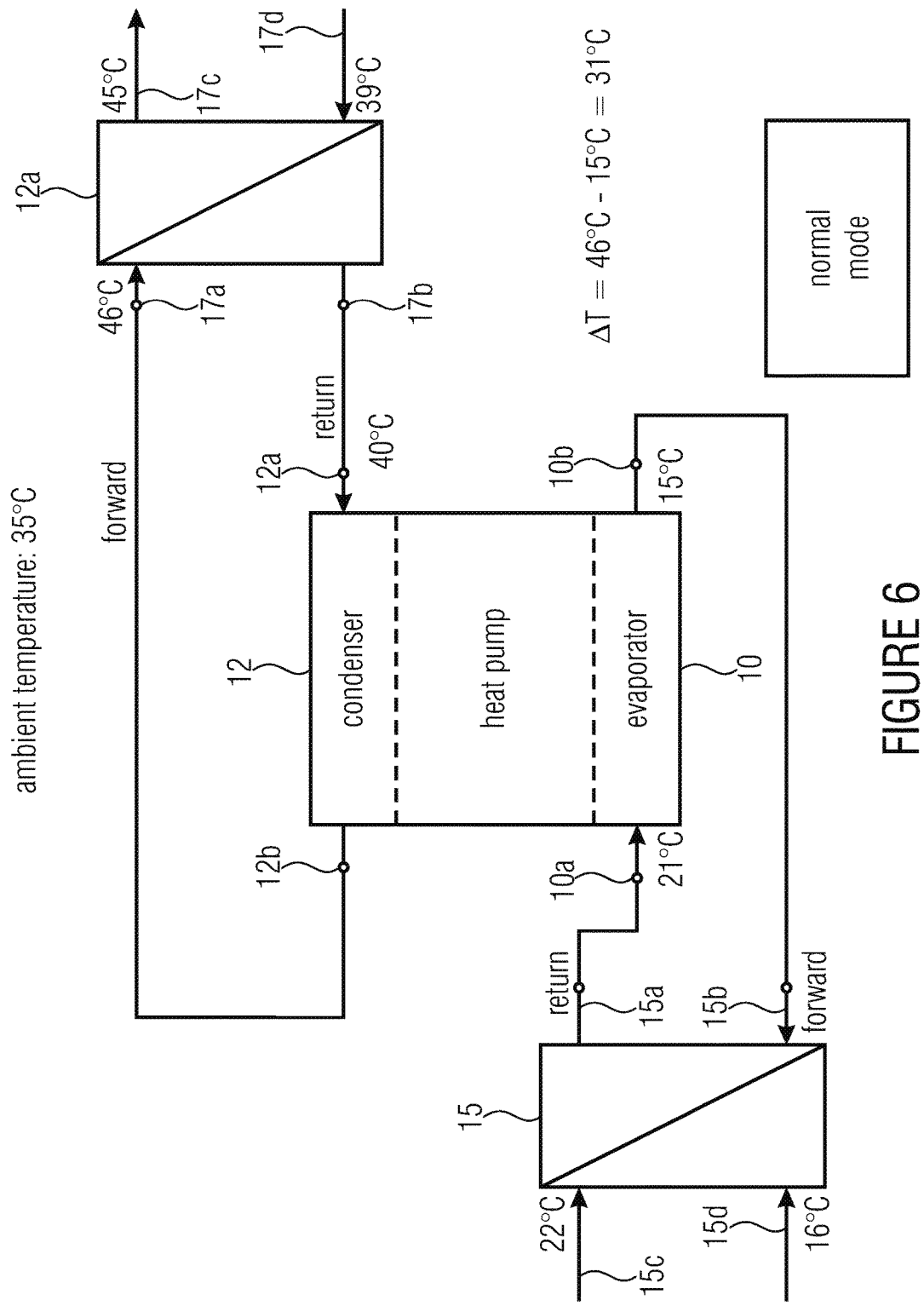
FIG. 6 shows a configuration of the heat pump of FIG. 2 in normal operating mode.

FIG. 1 further shows various temperature specifications at the respective terminals. Thus, in the embodiment shown in FIG. 1, it is assumed that the temperatures of the heat exchanger 17 or its secondary side, i.e. for example 23° Celsius and 17° Celsius, are obtained when the air has a temperature of, e.g. 13° Celsius. Here, the secondary circuit with terminals 17c, 17d of the heat exchanger 17 could be connected to a fan blowing the ambient air having, for example, 13° Celsius, through a radiator, whereby the liquid is cooled from 23° Celsius to 17° Celsius. On the primary side of the heat exchanger 17, this means that the forward has a temperature of 24° Celsius and the return a temperature of 18° Celsius. Since the temperature of 18° Celsius is already within the range in which the evaporator is normally "fed", according to the invention, the return of the heat exchanger 17 or the return from the region to be heated is fed into the evaporator inlet. The evaporator reaches a cooling by 3° Celsius at the evaporator outlet and thus obtains a temperature of 15° Celsius, which is suitable for reaching a respective set temperature in the region to be cooled which is, for example, 22° Celsius. This temperature can be found at the hot terminal of the secondary side of the heat exchanger 15 allocated to the region to be cooled, and reflects the situation where the object to be cooled has output so much energy to the medium that the cooling means has been heated from 16° Celsius to 20° Celsius. Due to the heat exchanger, this means that the hot terminal of the heat exchanger of the region to be cooled has a temperature of 21° Celsius. Contrary to the standard configuration where the return is coupled to the evaporator, the return is now coupled to the condenser inlet 12a, and the water which is advantageously used as cooling means is heated to 24° Celsius in the condenser due to the heat pump operation, and this energy is then output via the region to be heated or the heat exchanger 17. It is decisive that the temperature difference prevailing between the evaporator outlet 10b and the condenser outlet 12b is now merely 9° Celsius. This is a low temperature difference compared to the normal operation which is indicated in FIG. 6 and which amounts to, for example, 31° Celsius. According to the invention, the lower ambient temperature is used by the specific configuration such that a low temperature difference is obtained for the heat pump. Since the temperature difference, contrary to the flow, enters in a square manner into the power consumption of the heat pump (the flow enters only in a linear manner), any reduction of the temperature difference to be provided by the heat pump results in significant power savings and hence in an efficiency increase.

Further, at the terminals of the heat exchanger 17, more temperatures are marked. An ambient temperature of 10° Celsius, for example, has the effect that the cold terminal of the secondary side of the heat exchanger, indicated by 17d, has a temperature of 14° Celsius, and the hot terminal has a temperature of 20° Celsius. This means that the temperature on the primary side of the heat exchanger 17 is 15° Celsius. This temperature, that is fed into the evaporator inlet 10a, is exactly the same as the set temperature at the evaporator outlet, such that from a temperature of 15° Celsius at the evaporator inlet onwards, which corresponds to an ambient temperature of 10° Celsius in the given example, the heat pump can be completely taken out of operation, but the circulation can easily be maintained by evaporator and condenser. Merely the compressor is turned off, so that the power consumption of the heat pump reaches almost zero. At the same time, however, it is ensured that the waste heat from the region to be cooled is efficiently transferred to the region to be heated. This situation is shown exemplarily in FIG. 4a. The power consumption at an ambient temperature of 10° Celsius, i.e. the ambient temperature in the region to be heated is assumed to be almost 0%, and, at an ambient temperature of approximately 16° Celsius, the power consumption then increases up to a power consumption of 100% compared to a conventional configuration. In comparison, a normal heat pump would at any temperature have 100% power consumption, since the illustration in FIG. 4a already considers that at a lower ambient temperature the rotational speed of the compressor can be reduced also with a normal heat pump, since the overall amount of waste heat can be managed more easily and hence the flow decreases. However, contrary to the temperature difference, the flow enters linearly into the power consumption. Thus, the difference between 10° Celsius and 16° Celsius between the 0% line and the 100% line in FIG. 4a shows the efficiency increase of the inventive configuration illustrated in FIG. 1.

Figure 4A:
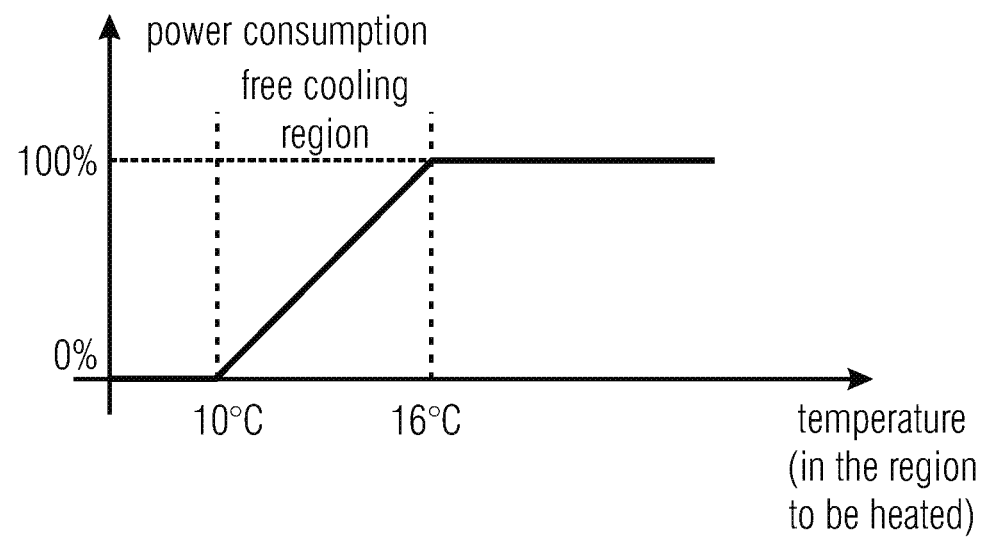
FIG. 4a shows a schematical illustration of the power consumption in the free cooling mode.
Figure 4B:
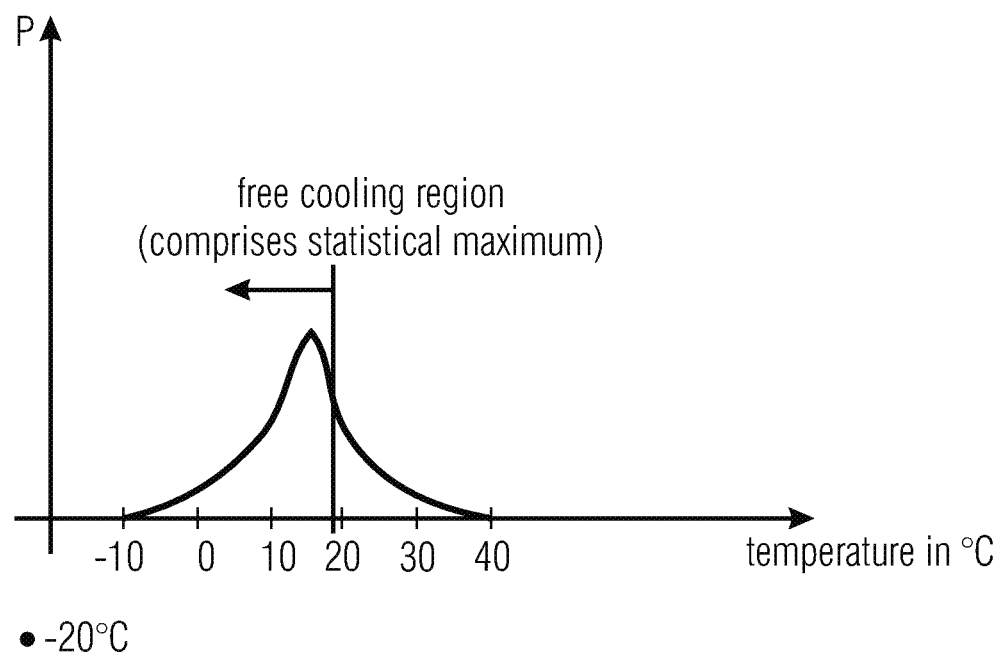
FIG. 4b shows a schematical illustration of the "Frankfurt table" in the context of the free cooling region.
Figure 5:
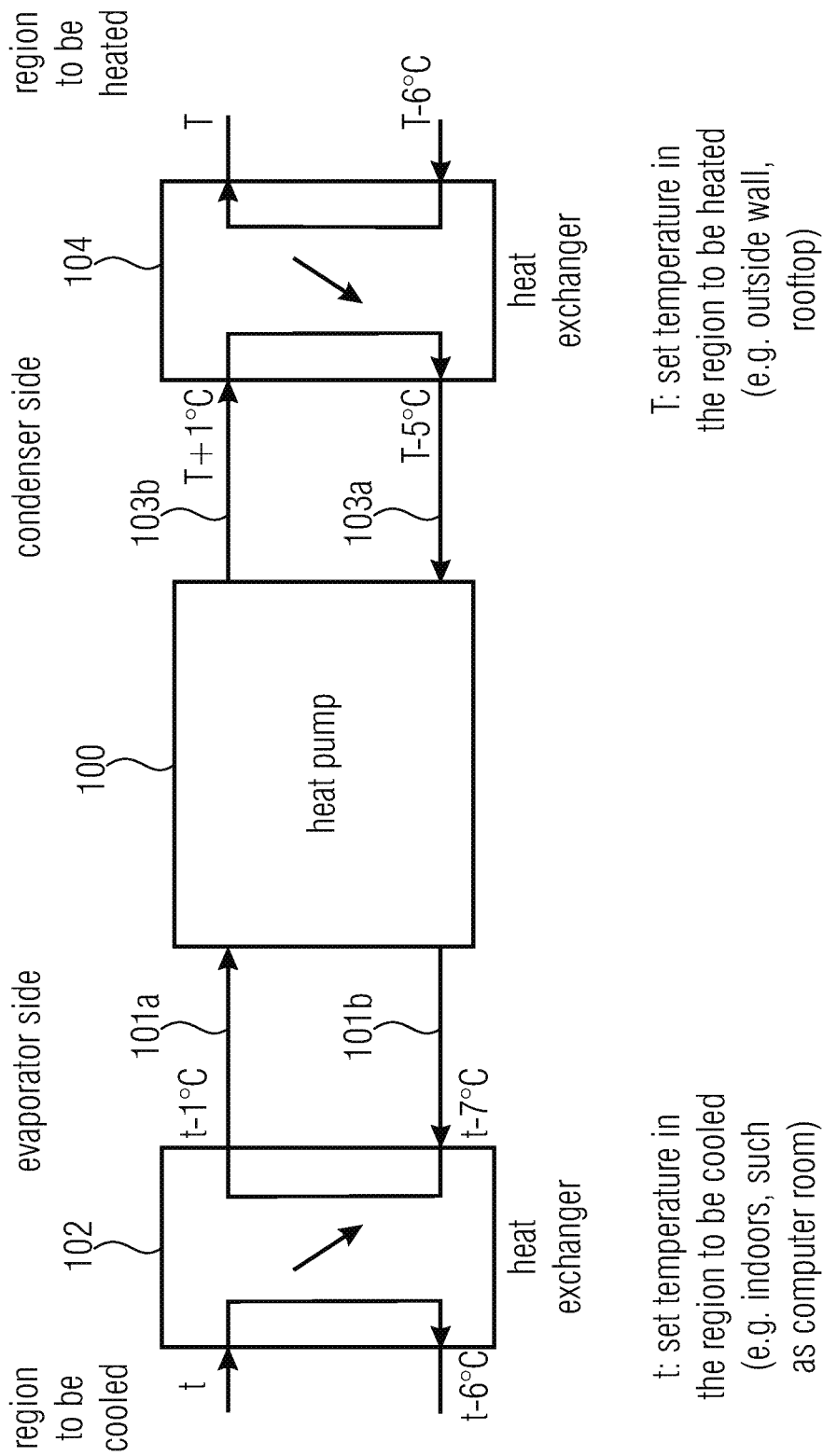
FIG. 5 shows an arrangement of a heat pump system between two heat exchangers.

FIG. 4b shows a probability distribution of the temperatures in degree Celsius, also known as the "Frankfurt table" and illustrates the probability that a specific temperature prevails in Central Germany throughout the year. It can be clearly seen that the peak of the probability distribution is completely at temperatures within the free cooling range or close to the same. In the configuration illustrated in FIG. 4a, the free cooling range already starts at an ambient temperature of 16° Celsius and this temperature is already to the right of the maximum of the probability distribution in FIG. 4b. This means that, seen statistically from the configuration illustrated in FIG. 1, in more than half of the time within a year an efficiency increase can be obtained compared to a normal configuration that becomes the better the lower the temperatures become.

At ambient temperatures above, e.g., 16° Celsius, the configuration shown in the example of FIG. 4a will no longer be sufficient to obtain cooling in the region to be cooled due to the set requirements. Thus, in an embodiment of the present invention, the configuration of the heat pump is implemented in a changeover manner. For this, a changeover means is provided that is implemented to separate the evaporator inlet 10a from the return 16b from the region to be heated, and to couple the return 14b from the region to be cooled to the evaporator inlet 10a. In the embodiment shown in FIG. 2, this functionality is obtained by the two switches I and II. Further, the changeover means is implemented to separate the condenser inlet 12a from the return 14b from the region to be cooled, and to couple the return 16b from the region to be heated to the condenser inlet 12a. This functionality is obtained in the embodiment shown in FIG. 2 by the two changeover switches III and IV.

The switch positions of changeover switches I, II, III, IV are illustrated for the two variations, i.e. the free cooling mode shown in FIG. 1 and the normal operating mode shown in FIG. 6. In normal mode, switch I is at position 2, switch II is at position 1, switch III is at position 1 and switch IV is at position 1. In contrast, in the free cooling mode, switch I is at position 1, in the free cooling mode, switch II is at position 2, in the free cooling mode, switch III is at position 1, and in the free cooling mode, switch IV is at position 2. With respect to the circulation of liquids, the free cooling mode is as illustrated in FIG. 1, and with respect to the circulation, the normal operating mode is as illustrated in FIG. 6. This means in the embodiment shown in FIG. 6, based on assumed realistic ambient temperatures in the summer of 35° Celsius, that the liquid in the cold terminal 17d of the secondary side of the heat exchanger for the region to be heated has a temperature of 39° Celsius and is heated up to 45° Celsius due to the heat exchanger effect. On the primary side of the heat exchanger 17, this means that the forward has a temperature of 46° Celsius and the return a temperature of 40° Celsius. However, on the evaporator side, as in the embodiment shown in FIG. 2, the secondary side of the heat exchanger 15 has the same set temperatures as in FIG. 2 or FIG. 1, and the primary side also has the same set temperatures. However, this means that the heat pump with the evaporator 10 and the condenser 12 has to overcome a significant temperature difference in the normal operating mode, i.e. 31° Celsius when the ambient temperature has an assumed maximum of, e.g., 35° Celsius.

Figure 2:
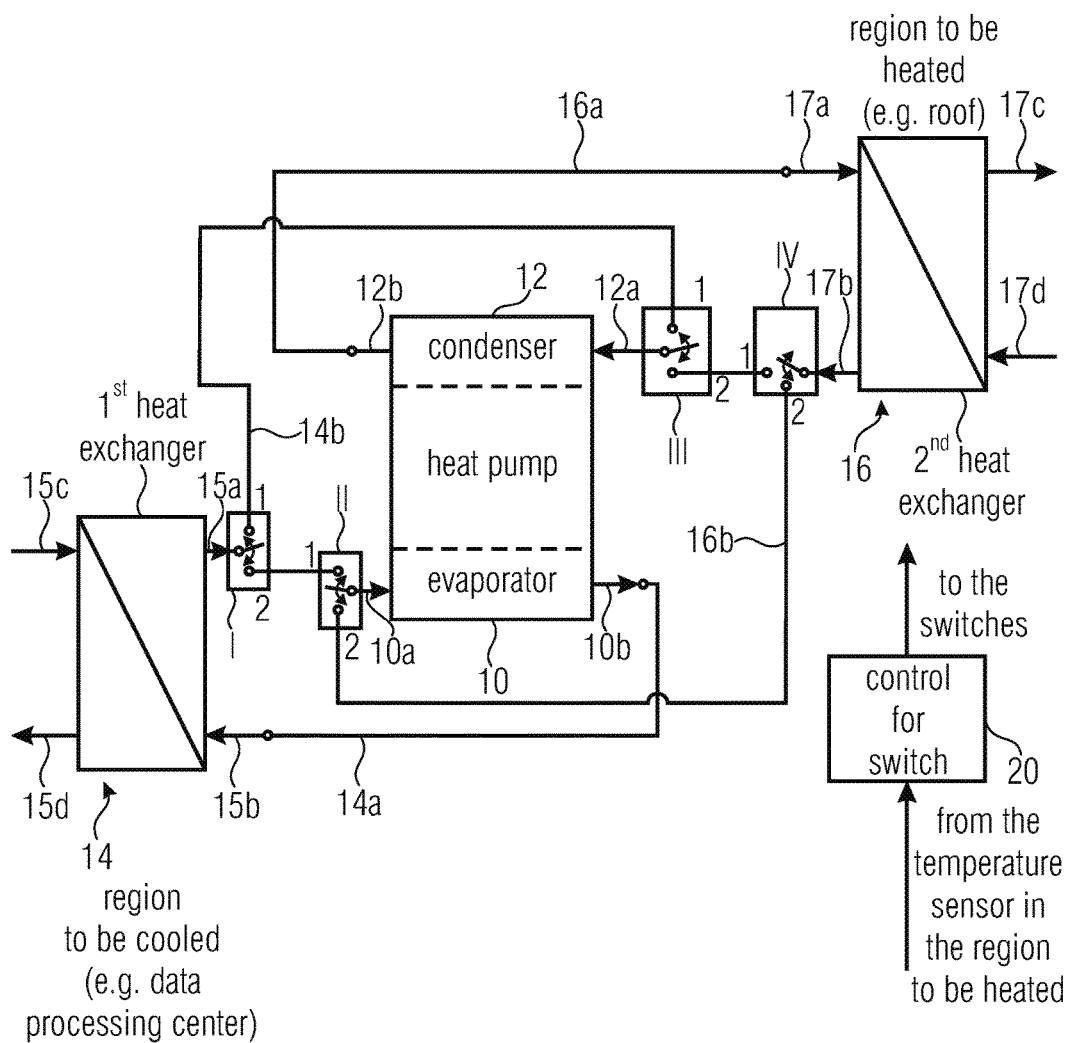
FIG. 2 shows a block diagram of an embodiment of the heat pump system with changeover means.

In embodiments of the present invention, as shown in FIG. 2 by the control 20, reconfiguration is performed depending on the temperature in the region to be heated, i.e. e.g. on the ambient temperature on the roof or on the facade of a building. If, in embodiments of the present invention, the ambient temperature is less or equal to 18° Celsius, and in particular less than or equal to 16° Celsius, the control can control switches I, II, III, IV such that the free cooling mode of FIG. 1 becomes active, while the normal mode will be controlled when the temperatures lie above. Thus, depending on the implementation, the normal mode can already be activated starting from 16° Celsius ambient temperature, and, depending on the implementation, also, for example, already starting from 18° Celsius ambient temperature. The exact changeover temperature depends in particular also on the implementation of the system and also on the implementation of the heat exchangers or whether heat exchangers are used at all. Further, it is also significant how strongly the heat transfer takes place from the ambient temperature into the secondary side of the heat exchanger 17 or, when no heat exchanger is used, into the forward and return 16a, 16b.

Changeover can also take place manually or in a time-controlled manner or by a combination of the stated measures. The manually operated changeover can be made by an operator of the plant, who receives the suggestion to reconfigure, for example by any type of display. Alternatively, changeover can also take place in a time-controlled manner, for example such that the plant is operated in the free cooling mode in winter, in the normal operating mode in summer, in the normal operating mode during the day in spring and autumn, and in the free cooling mode at night. Alternatively, the temporal condition and the temperature condition can be combined to control automatically or to give the operator an optimum suggestion for the configuration of the heat pump system.

In the following, the individual changeover switches in FIG. 2 will be discussed in more detail. The changeover switch I comprises an input connected to the hot terminal of the primary side of the first heat exchanger 15. Further, the changeover switch includes two outputs, wherein the first output is connected to a first input of the changeover switch III, and wherein the second output is connected to a first input of the changeover switch II. The changeover switch I can be controlled by the control 20 such that the input is either connected to the first output or to the second output.

The changeover switch II includes a single output connected to the evaporator inlet 10a. Above that, the changeover switch II includes two inputs, wherein the first input is connected to the second output of the changeover switch I, and wherein the second input is connected to the second output of the changeover switch IV. Again, the control 20 can control, for example electrically or mechanically or in any other way, the changeover switch II such that the output is either connected to the first input or to the second input.

The changeover switch III again comprises two inputs and one output. The output of the changeover switch III is connected to the condenser inlet 12a. The first input is connected to the first output of the changeover switch I, and the second input is connected to a first output of the changeover switch IV. Again, the control 20 is implemented to activate the changeover switch III, for example electrically or in any other way, such that either the first input or the second input is connected to the output of the switch and hence to the condenser inlet 12a.

The changeover switch IV comprises a single input connected to the cold terminal 17b of the heat exchanger 16 and in particular its primary side, while a first output of the changeover switch IV is connected to a second input of the changeover switch III, while the second output of the changeover switch IV is connected to the second input of the changeover switch II. Again, the control 20 is implemented to activate the changeover switch IV, for example electrically or in any other way, such that the input is either connected to the first output or to the second output. In particular, it is advantageous to form or couple the connections in a pressure-tight and liquid-tight manner, wherein respective liquid changeover switches are known in the art and typically have three pipe terminals towards the outside, by which the changeover switches can be coupled to the other respective terminals via pipes, advantageously plastic pipes, in a pressure- and liquid-tight manner.

Figure 3:
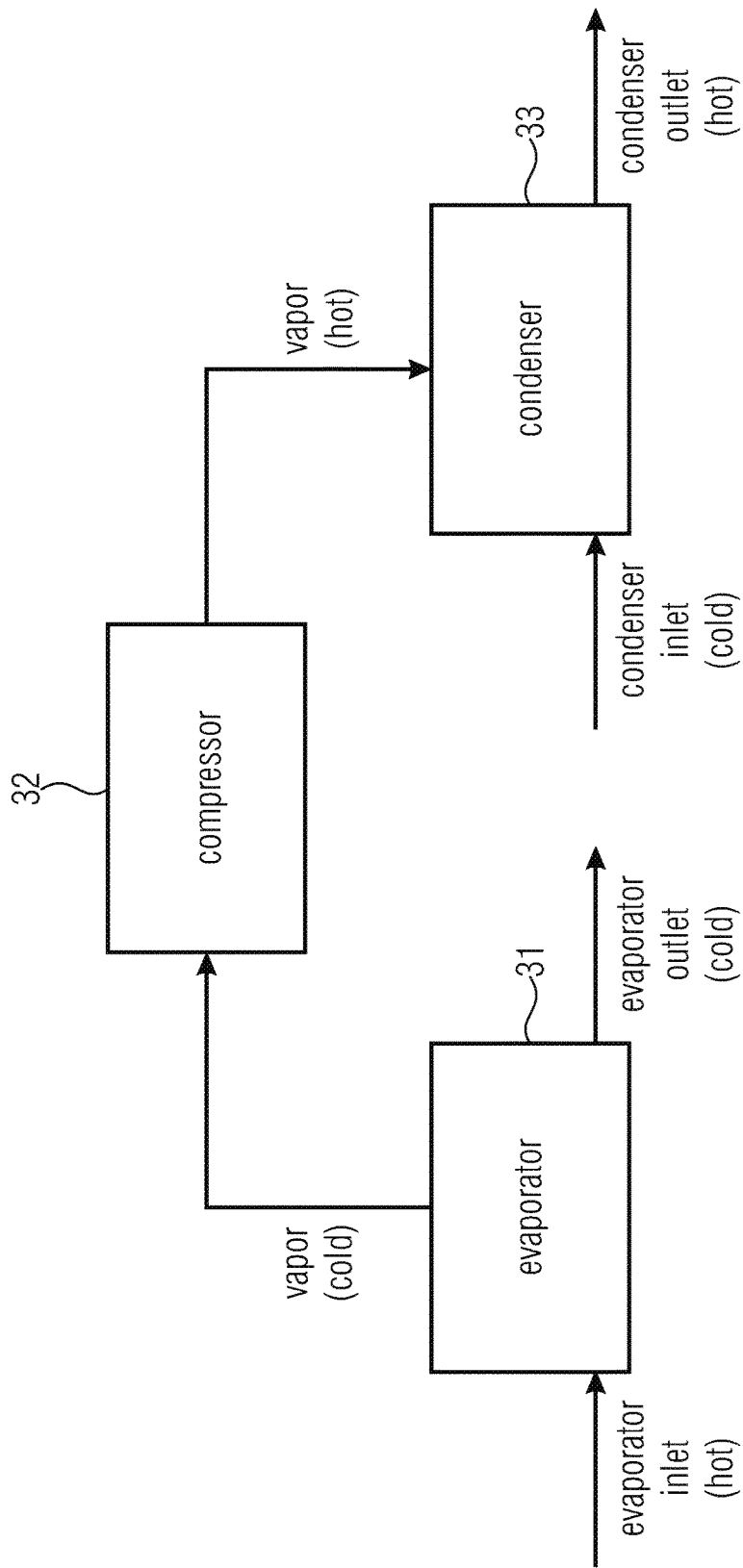
FIG. 3 shows an illustration of an internal structure of the heat pump of FIG. 1 or FIG. 2.
Figure 7:
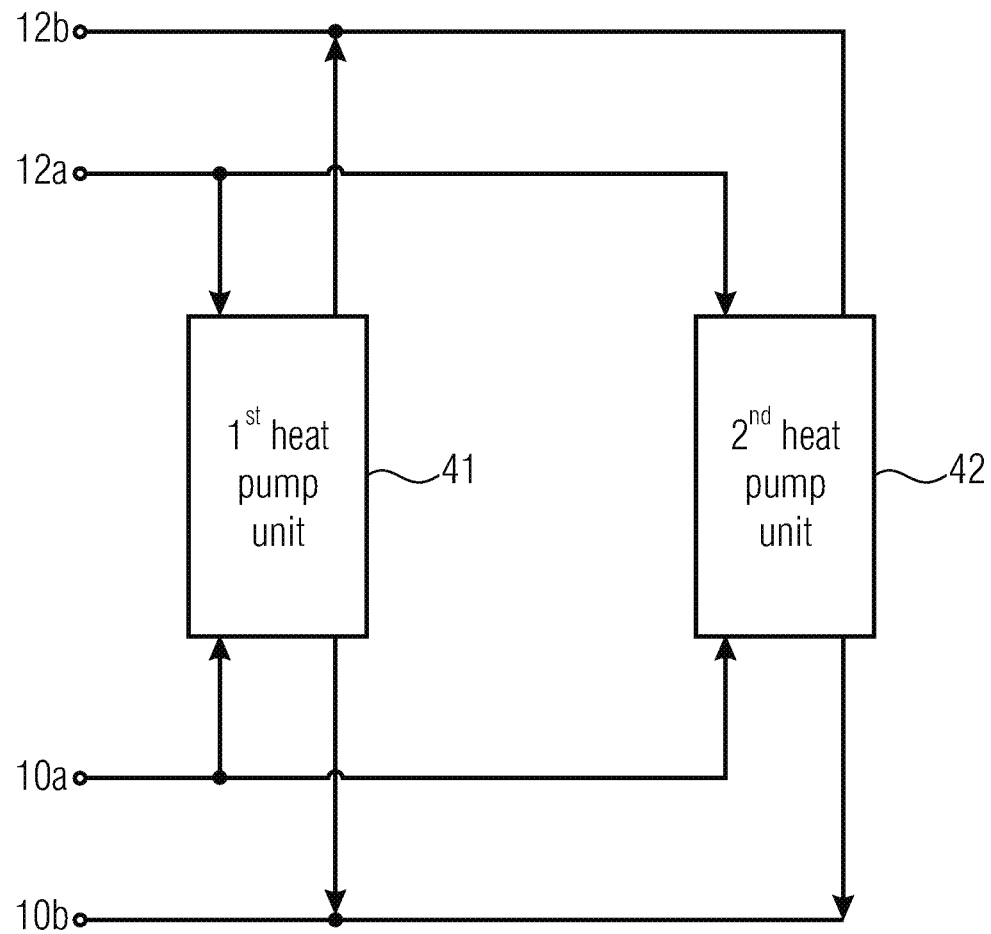
FIG. 7 shows a parallel connection of two heat pump stages for an exemplary implementation of the heat pump of FIG. 1 or FIG. 2.

FIG. 3 shows an implementation of a heat pump stage, in particular the structure of a heat pump unit of which one or several can exist in a heat pump stage. A heat pump unit consists of an evaporator 31, a compressor 32 and a condenser 33. The evaporator 31 includes an evaporator inlet for introducing the ("hot") operating medium to be evaporated, and further includes an evaporator outlet for letting out the ("cold") evaporating medium. Accordingly, the condenser 33 includes a condenser inlet for introducing the "cold" operating medium and for letting out the "hot" operating medium, wherein the media in the evaporators 31 and 33 are liquids. Above that, by the heat pump process, "cold" vapor from the evaporator 31 is compressed by the compressor 32 and heated, and the "hot" vapor is then fed into the condenser 33, so that the "hot" vapor is condensed and the liquid in the condenser 33 which is then let out through the condenser outlet, is heated by the "hot" vapor due to the condensation process. When a heat pump stage merely comprises one heat pump unit shown in FIG. 3, the inlets and outlets illustrated in FIGS. 1 and 2 correspond to the inlets and outlets of FIG. 3. Thus, each heat pump stage can also comprise an interconnection of individual heat pump units, such as the two heat pump units 41, 42 in FIG. 7. With respect to the designation of the inflows for the evaporator and the condenser or the outflows for the evaporator and the condenser, it has been assumed that the heat pump in FIG. 1 consists of a parallel connection of two heat pump units 41, 42 of FIG. 7.

While specific elements are described as device elements, it should be noted that this description is equally to be considered as description of steps of a method and vice versa. Thus, the block diagram shown in FIGS. 1 to 3, 5, 6, 7 also represents a flow diagram of a respective inventive method.

Depending on the circumstances, the inventive method for analyzing an information signal can be implemented in hardware or in software. The implementation can be made on a non-volatile memory medium, a digital or other memory medium, in particular a disc or a CD having electronically readable control signals that can cooperate with a programmable computer system such that the method is performed. Thus, the invention generally also consists of a computer program product having a program code stored on a machine-readable carrier for performing the method when the computer program product runs on a computer. In other words, the invention can be realized as a computer program having a program code for performing the method when the computer program runs on a computer.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A heat pump, comprising:
   an evaporator with an evaporator inlet and an evaporator outlet;
   a compressor for compressing operating liquid evaporated in the evaporator; and
   a condenser for condensing evaporated operating liquid compressed in the compressor, wherein the condenser comprises a condenser inlet and a condenser outlet,
   wherein the evaporator inlet is connected to a return from a region to be heated, and wherein the condenser inlet is connected to a return from a region to be cooled; and
   a switch for separating the evaporator inlet from the return from the region to be heated and for connecting the return from the region to be cooled to the evaporator inlet; and for separating the condenser inlet from the return from the region to be cooled and for connecting the return from the region to be heated to the condenser inlet.

2. The heat pump according to claim 1, further comprising:
   a first changeover switch whose input is coupled to the return of the region to be cooled;
   a second changeover switch whose output is coupled to the evaporator inlet;
   a third changeover switch whose output is coupled to the condenser inlet, and
   a fourth changeover switch whose input is coupled to the return of the region to be heated.

3. The heat pump according to claim 2,
   wherein a first output of the first changeover switch is connected to a first input of the third changeover switch,
   wherein a second output of the first changeover switch is coupled to a first input of the second changeover switch,
   wherein a second input of the third changeover switch is coupled to a first input of the fourth changeover switch, and
   wherein a second input of the second changeover switch is coupled to a second output of the fourth changeover switch.

4. The heat pump according to claim 1,
   wherein the evaporator outlet is connected to a forward to the region to be cooled, and
   wherein the condenser outlet is coupled to a forward to the region to be heated.

5. The heat pump according to claim 1, further comprising:
   a first heat exchanger allocated to the region to be cooled, wherein the return from the region to be cooled is connected to a first terminal of the first heat exchanger, and wherein the second terminal of the first heat exchanger is connected to the evaporator outlet.

6. The heat pump according to claim 1, further comprising:
   a second heat exchanger allocated to the region to be heated, wherein a first terminal of the second heat exchanger is connected to the return from the region to be heated, and wherein the second terminal of the second heat exchanger is connected to the condenser outlet.

7. The heat pump according to claim 1, further comprising:
   a control for reconfiguring the heat pump from a free cooling mode to a normal operating mode,
   wherein the control is implemented to provide a diversion of the return from the region to be heated and the return from the region to be cooled.

8. The heat pump according to claim 1,
   wherein the control is implemented to operate the switch.

9. The heat pump according to claim 1, further comprising:
   a provider for providing an ambient temperature of the region to be heated, wherein a control is implemented to reconfigurate, depending on the ambient temperature of the region to be heated, the heat pump from a free cooling mode into a normal operating mode or from the normal operating mode into the free cooling mode.

10. The heat pump according to claim 1,
    wherein the return from the region to be heated comprises a pipe connected to the evaporator inlet in a liquid-tight and pressure-tight manner, and
    wherein the return from the region to be cooled comprises a pipe connected to the condenser inlet in a liquid-tight and pressure-tight manner.

11. The heat pump according to claim 1,
    wherein the heat pump comprises several interconnected heat pump units, wherein each heat pump unit comprises an evaporator, a compressor and a condenser.

12. The heat pump according to claim 1,
    wherein the operating liquid is water and the evaporator is implemented to exhibit a negative pressure so that the water evaporates at a temperature of less than 25° Celsius.

13. A method for pumping heat with a heat pump comprising an evaporator with an evaporator inlet and an evaporator outlet, a compressor for compressing operating liquid evaporated in the evaporator, and a condenser for condensing evaporated operating liquid compressed in the compressor, wherein the condenser comprises a condenser inlet and a condenser outlet, comprising:
   introducing operating liquid from a return from a region to be heated into the evaporator inlet;
   introducing operating liquid from a return from a region to be cooled into the condenser inlet;
   separating the evaporator inlet from the return from the region to be heated;
   connecting the return from the region to be cooled to the evaporator inlet;
   separating the condenser inlet from the return of the region to be cooled; and
   connecting the return from the region to be heated to the condenser inlet.

14. A method for producing a heat pump, comprising:
providing an evaporator with an evaporator inlet and an evaporator outlet, a compressor for compressing operating liquid evaporated in the evaporator; and a condenser for condensing evaporated operating liquid compressed in the compressor, wherein the condenser comprises a condenser inlet and a condenser outlet;
connecting the evaporator inlet to a return from a region to be heated; and
connecting the condenser inlet to a return from a region to be cooled;
providing a switch for separating the evaporator inlet from the return from the region to be heated; for connecting the return from the region to be cooled to the evaporator inlet; for separating the condenser inlet from the return of the region to be cooled; and for connecting the return from the region to be heated to the condenser inlet.

15. A heat pump, comprising:
an evaporator with an evaporator inlet and an evaporator outlet;
a compressor for compressing operating liquid evaporated in the evaporator;
a condenser for condensing evaporated operating liquid compressed in the compressor, wherein the condenser comprises a condenser inlet and a condenser outlet,
wherein the evaporator inlet is connected to a return from a region to be heated, wherein the condenser inlet is connected to a return from a region to be cooled; and
wherein the evaporator outlet is connected to a forward to the region to be cooled, and wherein the condenser outlet is coupled to a forward to the region to be heated.

16. A heat pump, comprising:
an evaporator with an evaporator inlet and an evaporator outlet;
a compressor for compressing operating liquid evaporated in the evaporator;
a condenser for condensing evaporated operating liquid compressed in the compressor, wherein the condenser comprises a condenser inlet and a condenser outlet,
wherein the evaporator inlet is connected to a return from a region to be heated, and wherein the condenser inlet is connected to a return from a region to be cooled; and
a first heat exchanger allocated to the region to be heated, wherein the return from the region to be cooled is connected to a first terminal of the first heat exchanger, and wherein the second terminal of the first heat exchanger is connected to the evaporator outlet; or
a second heat exchanger allocated to the region to be heated, wherein a first terminal of the second heat exchanger is connected to the return from the region to be heated, and wherein the second terminal of the second heat exchanger is connected to the condenser outlet.

17. A heat pump, comprising:
an evaporator with an evaporator inlet and an evaporator outlet;
a compressor for compressing operating liquid evaporated in the evaporator;
a condenser for condensing evaporated operating liquid compressed in the compressor, wherein the condenser comprises a condenser inlet and a condenser outlet,
wherein the evaporator inlet is connected to a return from a region to be heated, and wherein the condenser inlet is connected to a return from a region to be cooled; and
a control for reconfiguring the heat pump from a free cooling mode to a normal operating mode,
wherein the control is implemented to provide a diversion of the return from the region to be heated and the return from the region to be cooled.

18. A heat pump, comprising:
an evaporator with an evaporator inlet and an evaporator outlet;
a compressor for compressing operating liquid evaporated in the evaporator;
a condenser for condensing evaporated operating liquid compressed in the compressor, wherein the condenser comprises a condenser inlet and a condenser outlet,
wherein the evaporator inlet is connected to a return from a region to be heated, and wherein the condenser inlet is connected to a return from a region to be cooled; and
a provider for providing an ambient temperature of the region to be heated, wherein a control is implemented to reconfigure, depending on the ambient temperature of the region to be heated, the heat pump from a free cooling mode into a normal operating mode or from the normal operating mode into the free cooling mode.

19. A heat pump, comprising:
an evaporator with an evaporator inlet and an evaporator outlet;
a compressor for compressing operating liquid evaporated in the evaporator;
a condenser for condensing evaporated operating liquid compressed in the compressor, wherein the condenser comprises a condenser inlet and a condenser outlet,
wherein the evaporator inlet is connected to a return from a region to be heated, and wherein the condenser inlet is connected to a return from a region to be cooled; and
wherein the return from the region to be heated comprises a pipe connected to the evaporator inlet in a liquid-tight and pressure-tight manner, and wherein the return from the region to be cooled comprises a pipe connected to the condenser inlet in a liquid-tight and pressure-tight manner, or
wherein the heat pump comprises several interconnected heat pump units, wherein each heat pump unit comprises an evaporator, a compressor and a condenser, or
wherein the operating liquid is water and the evaporator is implemented to exhibit a negative pressure so that the water evaporates at a temperature of less than 25° Celsius.

20. A heat pump system, comprising:
a region to be heated with a return from the region to be heated;
a region to be cooled with a return from the region to be cooled; and
a heat pump according to any one of the claims 1, 15, 16, 17, 18, 19.

21. The heat pump according to claim 18,
wherein the control is implemented to configure the heat pump into the free cooling mode at a temperature of less than or equal to 20° Celsius in the region to be heated, or to configure the heat pump into the normal operating mode at an ambient temperature of more than or equal to 15° Celsius.

22. A method for pumping heat with a heat pump comprising an evaporator with an evaporator inlet and an evaporator outlet, a compressor for compressing operating liquid evaporated in the evaporator, and a condenser for condensing evaporated operating liquid compressed in the compressor, wherein the condenser comprises a condenser inlet and a condenser outlet, the method comprising:
introducing operating liquid from a return from a region to be heated into the evaporator inlet; and introducing operating liquid from a return from a region to be cooled into the condenser inlet;
wherein the evaporator outlet is connected to a forward to the region to be cooled, and wherein the condenser outlet is coupled to a forward to the region to be heated.

23. A method for pumping heat with a heat pump comprising an evaporator with an evaporator inlet and an evaporator outlet, a compressor for compressing operating liquid evaporated in the evaporator, and a condenser for condensing evaporated operating liquid compressed in the compressor, wherein the condenser comprises a condenser inlet and a condenser outlet, the method comprising:
introducing operating liquid from a return from a region to be heated into the evaporator inlet; and
introducing operating liquid from a return from a region to be cooled into the condenser inlet;
wherein the heat pump further comprises a first heat exchanger allocated to the region to be cooled, wherein the return from the region to be cooled is connected to a first terminal of the first heat exchanger, and wherein the second terminal of the first heat exchanger is connected to the evaporator outlet; or
wherein the heat pump further comprises a second heat exchanger allocated to the region to be heated, wherein a first terminal of the second heat exchanger is connected to the return from the region to be heated, and wherein the second terminal of the second heat exchanger is connected to the condenser outlet.

24. A method for pumping heat with a heat pump comprising an evaporator with an evaporator inlet and an evaporator outlet, a compressor for compressing operating liquid evaporated in the evaporator, and a condenser for condensing evaporated operating liquid compressed in the compressor, wherein the condenser comprises a condenser inlet and a condenser outlet, the method comprising:
introducing operating liquid from a return from a region to be heated into the evaporator inlet;
introducing operating liquid from a return from a region to be cooled into the condenser inlet; and
reconfiguring the heat pump from a free cooling mode to a normal operating mode, wherein the reconfiguring comprises providing a diversion of the return from the region to be heated and the return from the region to be cooled.

25. A method for pumping heat with a heat pump comprising an evaporator with an evaporator inlet and an evaporator outlet, a compressor for compressing operating liquid evaporated in the evaporator, and a condenser for condensing evaporated operating liquid compressed in the compressor, wherein the condenser comprises a condenser inlet and a condenser outlet, the method comprising:
introducing operating liquid from a return from a region to be heated into the evaporator inlet;
introducing operating liquid from a return from a region to be cooled into the condenser inlet;
providing an ambient temperature of the region to be heated, and
reconfiguring, depending on the ambient temperature of the region to be heated, the heat pump from a free cooling mode into a normal operating mode or from the normal operating mode into the free cooling mode.

26. A method for pumping heat with a heat pump comprising an evaporator with an evaporator inlet and an evaporator outlet, a compressor for compressing operating liquid evaporated in the evaporator, and a condenser for condensing evaporated operating liquid compressed in the compressor, wherein the condenser comprises a condenser inlet and a condenser outlet, the method comprising:
introducing operating liquid from a return from a region to be heated into the evaporator inlet; and
introducing operating liquid from a return from a region to be cooled into the condenser inlet;
wherein the return from the region to be heated comprises a pipe connected to the evaporator inlet in a liquid-tight and pressure-tight manner, and wherein the return from the region to be cooled comprises a pipe connected to the condenser inlet in a liquid-tight and pressure-tight manner, or
wherein the heat pump comprises several interconnected heat pump units, wherein each heat pump unit comprises an evaporator, a compressor and a condenser, or
wherein the operating liquid is water and the evaporator is implemented to exhibit a negative pressure so that the water evaporates at a temperature of less than 25° Celsius.

27. A method for producing a heat pump, comprising:
providing an evaporator with an evaporator inlet and an evaporator outlet, a compressor for compressing operating liquid evaporated in the evaporator; and a condenser for condensing evaporated operating liquid compressed in the compressor, wherein the condenser comprises a condenser inlet and a condenser outlet;
connecting the evaporator inlet to a return from a region to be heated;
connecting the condenser inlet to a return from a region to be cooled;
connecting the evaporator outlet to a forward to the region to be cooled; and
connecting the condenser outlet to a forward to the region to be heated.

28. A method for producing a heat pump, comprising:
providing an evaporator with an evaporator inlet and an evaporator outlet, a compressor for compressing operating liquid evaporated in the evaporator; and a condenser for condensing evaporated operating liquid compressed in the compressor, wherein the condenser comprises a condenser inlet and a condenser outlet;
connecting the evaporator inlet to a return from a region to be heated;
connecting the condenser inlet to a return from a region to be cooled;
coupling a first heat exchanger allocated to the region to be cooled, wherein the return from the region to be cooled is connected to a first terminal of the first heat exchanger, and wherein the second terminal of the first heat exchanger is connected to the evaporator outlet; or
coupling a second heat exchanger allocated to the region to be heated, wherein a first terminal of the second heat exchanger is connected to the return from the region to be heated, and wherein the second terminal of the second heat exchanger is connected to the condenser outlet.

29. A method for producing a heat pump, comprising:
providing an evaporator with an evaporator inlet and an evaporator outlet, a compressor for compressing operating liquid evaporated in the evaporator; and a condenser for condensing evaporated operating liquid compressed in the compressor, wherein the condenser comprises a condenser inlet and a condenser outlet;
connecting the evaporator inlet to a return from a region to be heated;
connecting the condenser inlet to a return from a region to be cooled;

coupling a control for reconfiguring the heat pump from a free cooling mode to a normal operating mode, wherein the control is implemented to provide a diversion of the return from the region to be heated and the return from the region to be cooled.

30. A method for producing a heat pump, comprising:

providing an evaporator with an evaporator inlet and an evaporator outlet, a compressor for compressing operating liquid evaporated in the evaporator; and a condenser for condensing evaporated operating liquid compressed in the compressor, wherein the condenser comprises a condenser inlet and a condenser outlet;

connecting the evaporator inlet to a return from a region to be heated;

connecting the condenser inlet to a return from a region to be cooled; and coupling a provider for providing an ambient temperature of the region to be heated, wherein a control is implemented to reconfigure, depending on the ambient temperature of the region to be heated, the heat pump from a free cooling mode into a normal operating mode or from the normal operating mode into the free cooling mode.

31. A method for producing a heat pump, comprising:

providing an evaporator with an evaporator inlet and an evaporator outlet, a compressor for compressing operating liquid evaporated in the evaporator; and a condenser for condensing evaporated operating liquid compressed in the compressor, wherein the condenser comprises a condenser inlet and a condenser outlet;

connecting the evaporator inlet to a return from a region to be heated;

connecting the condenser inlet to a return from a region to be cooled;

wherein the return from the region to be heated comprises a pipe connected to the evaporator inlet in a liquid-tight and pressure-tight manner, and wherein the return from the region to be cooled comprises a pipe connected to the condenser inlet in a liquid-tight and pressure-tight manner, or wherein the heat pump comprises several interconnected heat pump units, wherein each heat pump unit comprises an evaporator, a compressor and a condenser, or wherein the operating liquid is water and the evaporator is implemented to exhibit a negative pressure so that the water evaporates at a temperature of less than 25° Celsius.

* * * * *